(12) United States Patent
Berens et al.

(10) Patent No.: US 12,483,256 B2
(45) Date of Patent: Nov. 25, 2025

(54) SUCCESSIVE APPROXIMATION REGISTER ANALOG-TO-DIGITAL CONVERTER WITH PROGRAMMABLE SAMPLING NOISE CANCELLATION

(71) Applicant: NXP B.V., Eindhoven (NL)

(72) Inventors: Michael Todd Berens, Austin, TX (US); Khoi Mai, Austin, TX (US); Ashutosh Jain, Pensacola, FL (US); Dylan John Rosser, Austin, TX (US)

(73) Assignee: NXP B.V., Eindhoven (NL)

( * ) Notice: Subject to any disclaimer, the term of this patent is extended or adjusted under 35 U.S.C. 154(b) by 194 days.

(21) Appl. No.: 18/459,219

(22) Filed: Aug. 31, 2023

(65) Prior Publication Data

US 2025/0080127 A1    Mar. 6, 2025

(51) Int. Cl.
*H03M 1/12* (2006.01)
*H03M 1/08* (2006.01)

(52) U.S. Cl.
CPC ..................................... *H03M 1/08* (2013.01)

(58) Field of Classification Search
CPC .......... H03M 1/125; H03M 1/38; H03M 1/46; H03M 1/466; H03M 1/0607; H03M 1/0836; H03M 1/12; H03M 1/002; H03M 1/0617; H03M 1/08; H03M 1/00; H03M 1/0854; H03M 1/1023; H03M 1/804; H03M 3/426; H03M 1/06; H03M 1/0656; H03M 1/0695; H03M 1/0697; H03M 1/10; H03M 1/1215; H03M 1/14; H03M 1/164; H03M 1/40; H03M 3/458; H03M 3/46; H03M 3/464; H03M 1/02; H03M 1/0604; H03M 1/0612;
(Continued)

(56) References Cited

U.S. PATENT DOCUMENTS 8,362,940 B2 * 1/2013 Yoshioka .............. H03M 1/125
                                                              341/118
8,786,483 B1 * 7/2014 Thompson .......... H03M 1/0836
                                                              341/161
(Continued)

OTHER PUBLICATIONS

Liu et al., A 13-bit 0.005-mm2 40-MS/s SAR ADC With KT/C Noise Cancellation, IEEE Journal of Solid-State Circuits, vol. 55, No. 12, pp. 3260-3270, Dec. 2020.
(Continued)

*Primary Examiner* — Linh V Nguyen

(57) ABSTRACT

An analog-to-digital converter (ADC) includes a digital-to-analog converter (DAC), a comparator coupled to an output of the DAC, a successive approximation register (SAR) logic unit coupled to an output of the comparator, and a programmable delay unit. The comparator includes a preamplifier having an input coupled to the output of the DAC and a latch having an input coupled to the output of the preamplifier and an output coupled to the input of the SAR logic unit. SAR logic unit generates a control signal, and programmable delay unit adjusts a delay between the control signal and a delayed control signal based on at least one parameter, such that comparator receives control signal and delayed control signal. In some implementations, the parameter is at least one of a frequency of a signal input to the DAC, a source impedance of a circuit driving the input signal, and a preamplifier power mode.

20 Claims, 3 Drawing Sheets

(58) Field of Classification Search
CPC ............ H03M 1/0624; H03M 1/0626; H03M 1/0682; H03M 1/069; H03M 1/089; H03M 1/1033; H03M 1/1061; H03M 1/1071; H03M 1/1095; H03M 1/121; H03M 1/124; H03M 1/1245; H03M 1/127; H03M 1/34; H03M 1/361; H03M 1/50; H03M 1/687; H03M 3/30; H03M 3/37; H03M 3/418; H03M 3/454

USPC .......................................... 341/118–121, 155

See application file for complete search history.

(56) References Cited

U.S. PATENT DOCUMENTS

| | | | | |
|---|---|---|---|---|
| 9,755,657 | B2* | 9/2017 | Baek | H03M 1/466 |
| 9,774,345 | B1* | 9/2017 | Yoshioka | H03M 1/0854 |
| 9,866,232 | B2* | 1/2018 | Furuta | H03M 1/125 |
| 9,874,895 | B2* | 1/2018 | Yoshioka | H03K 5/151 |
| 11,063,602 | B1 | 7/2021 | Bodnar et al. | |
| 2014/0022105 | A1* | 1/2014 | Chen | H03M 1/0682 341/161 |
| 2014/0210653 | A1* | 7/2014 | Harpe | H03M 1/08 341/110 |
| 2017/0104480 | A1 | 4/2017 | Eshel | |
| 2024/0204793 | A1* | 6/2024 | Huang | H03M 1/468 |
| 2024/0356559 | A1* | 10/2024 | Oh | H03M 1/462 |
| 2025/0030433 | A1* | 1/2025 | Chen | H03M 1/38 |

OTHER PUBLICATIONS

Zhan et al., "A 0.004mm2 200MS/S Pipelined SAR ADC with kT/C Noise Cancellation and Robust Ring-Amp," 2022 IEEE International Solid-State Circuits Conference (ISSCC), 2022, pp. 164-166.

Kapusta et al., "Sampling circuits that break the kT/C thermal noise limit," Proceedings of the IEEE 2013 Custom Integrated Circuits Conference, San Jose, CA, USA, 2013, pp. 1-6.

Shen et al., "A Two-Step ADC With a Continuous-Time SAR-Based First Stage," in IEEE Journal of Solid-State Circuits, vol. 54, No. 12, pp. 3375-3385, Dec. 2019.

* cited by examiner

SUCCESSIVE APPROXIMATION REGISTER ANALOG-TO-DIGITAL CONVERTER WITH PROGRAMMABLE SAMPLING NOISE CANCELLATION

BACKGROUND

Some successive approximation register (SAR) analog-to-digital converters reduce sampling noise using a fixed delay across a preamplifier included in the comparator. During this delay the sampling noise and errors from the DAC are gained up and stored at the output of the preamplifier. Remaining errors from the delayed sample at preamplifier output are reduced through the preamplifier gain. However, using a fixed delay only reduces sampling noise in narrow use cases having a predetermined input signal frequency and preamplifier bandwidth. For example, the fixed delay is chosen based on an expected input signal frequency and does not reduce sampling noise as well for input signals having a frequency twice the expected input signal frequency. In addition, the fixed delay does not reduce sampling noise as well for an input signal having the expected input signal frequency but driven by a circuit having a higher impedance than expected. Further, a long delay time reduces the bandwidth requirement and power of the preamplifier, but can lead to saturation of the preamplifier. A short delay time reduces the likelihood of saturation of the preamplifier but increases the bandwidth requirement and power used by the preamplifier. Thus, an improved technique for reducing sampling noise is needed.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

As discussed previously herein, some techniques for reducing sampling noise in SAR ADCs use a fixed delay across a preamplifier included in the comparator and so reduce sampling noise in only certain narrow use cases having a predetermined input signal frequency and preamplifier bandwidth. The disclosed techniques for implementing a programmable delay across the preamplifier allow SAR ADCs to reduce sampling noise while accommodating a range of input source impedances, signal frequencies, and power restrictions. In addition, a general-purpose SAR ADC used in a variety of applications can adjust the programmable delay based on the current operating parameters to reduce sampling noise across a range of use-cases.

Figure 1:
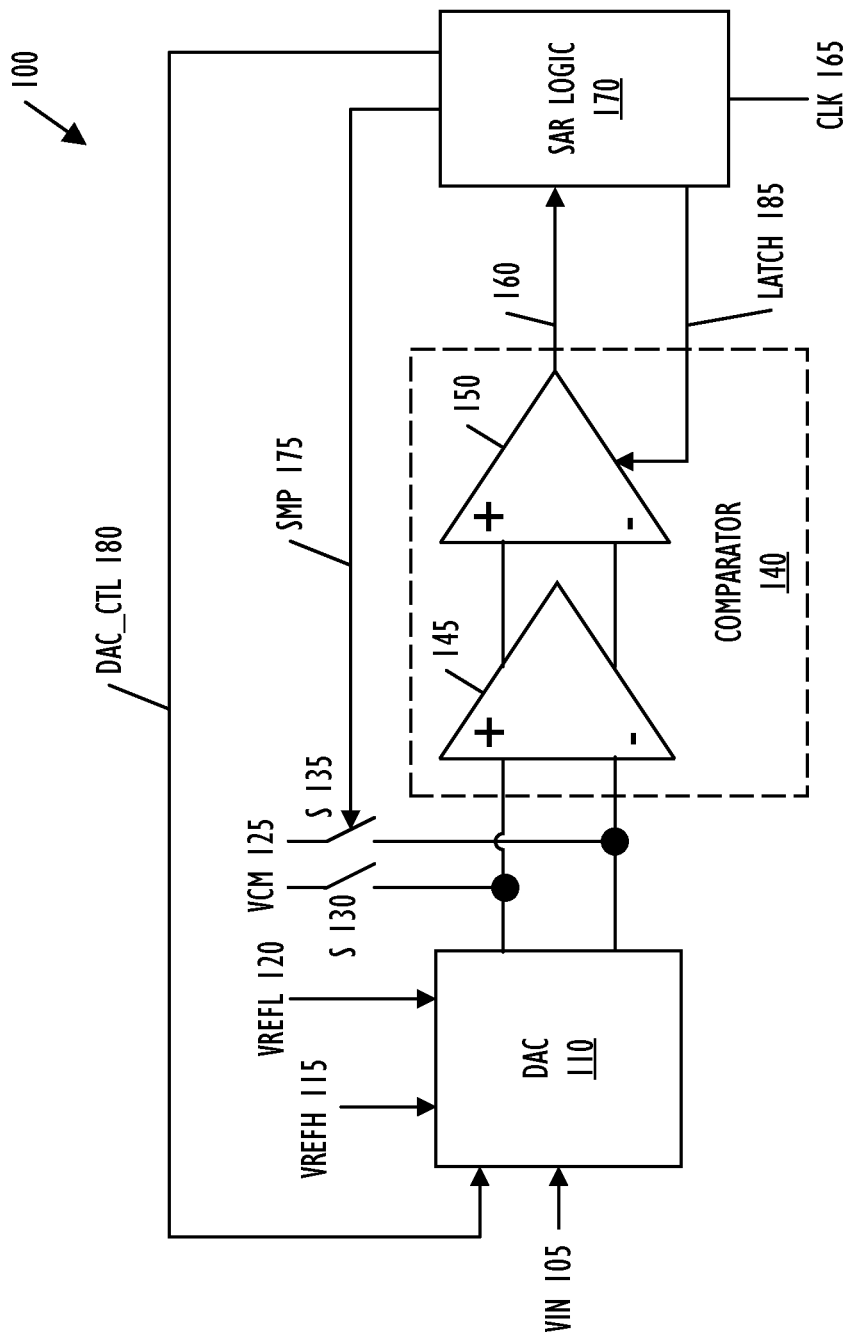
FIG. 1 shows, in block diagram form, an example analog to digital converter (ADC) system, according to one embodiment.

FIG. 1 shows, in block diagram form, an example analog to digital converter (ADC) system 100, according to one embodiment. The ADC system 100 includes a digital to analog converter (DAC) 110, a comparator 140, and a successive approximation register (SAR) logic unit 170. In some implementations, the comparator 140 includes a preamplifier 145 and a latch 150. The ADC system 100 converts an analog input voltage Vin 105 into a corresponding binary value. In an embodiment of the present invention, the ADC system 100 is a single-ended SAR ADC. In an embodiment of the present invention, the ADC system 100 has a resolution of n bits in which 'n' is a positive integer greater than 1.

The DAC 110 receives the input voltage Vin 105, DAC control signals DAC_CTL 180, a high reference voltage VREFH 115, and a low reference voltage VREFL 120. The high reference voltage VREFH 115 has a greater value than the low reference voltage VREFL 120. A first output of the DAC 110 is coupled to a positive input of the preamplifier 145 in the comparator 140, and a second output of the DAC 110 is coupled to a negative input of the preamplifier 145. The positive input of the preamplifier 145 is coupled to a first terminal of switch S 130, and the negative input of the preamplifier 145 is coupled to a first terminal of switch S 135. The second terminals of the switches S 130 and 135 are configured to receive a common mode voltage VCM 125. The switches S 130 and 135 are configured to open and close based on a sampling control signal SMP 175 provided by the SAR logic unit 170.

A first output of the preamplifier 145 is coupled to a positive input of the latch 150, and a second output of the preamplifier 145 is coupled to a negative input of the latch 150. The latch 150 also received a control signal LATCH 185 provided by the SAR logic unit 170. The output 160 of the latch 150 and the comparator 140 is provided to the SAR logic unit 170, which also receives a clock signal CLK 165. The SAR logic unit 170 generates the DAC control signals DAC_CTL 180 for the DAC 110, the sampling control signal SMP 175 for the switches S 130 and 135, and the latch control signal LATCH 185 for the latch 150.

Figure 2:
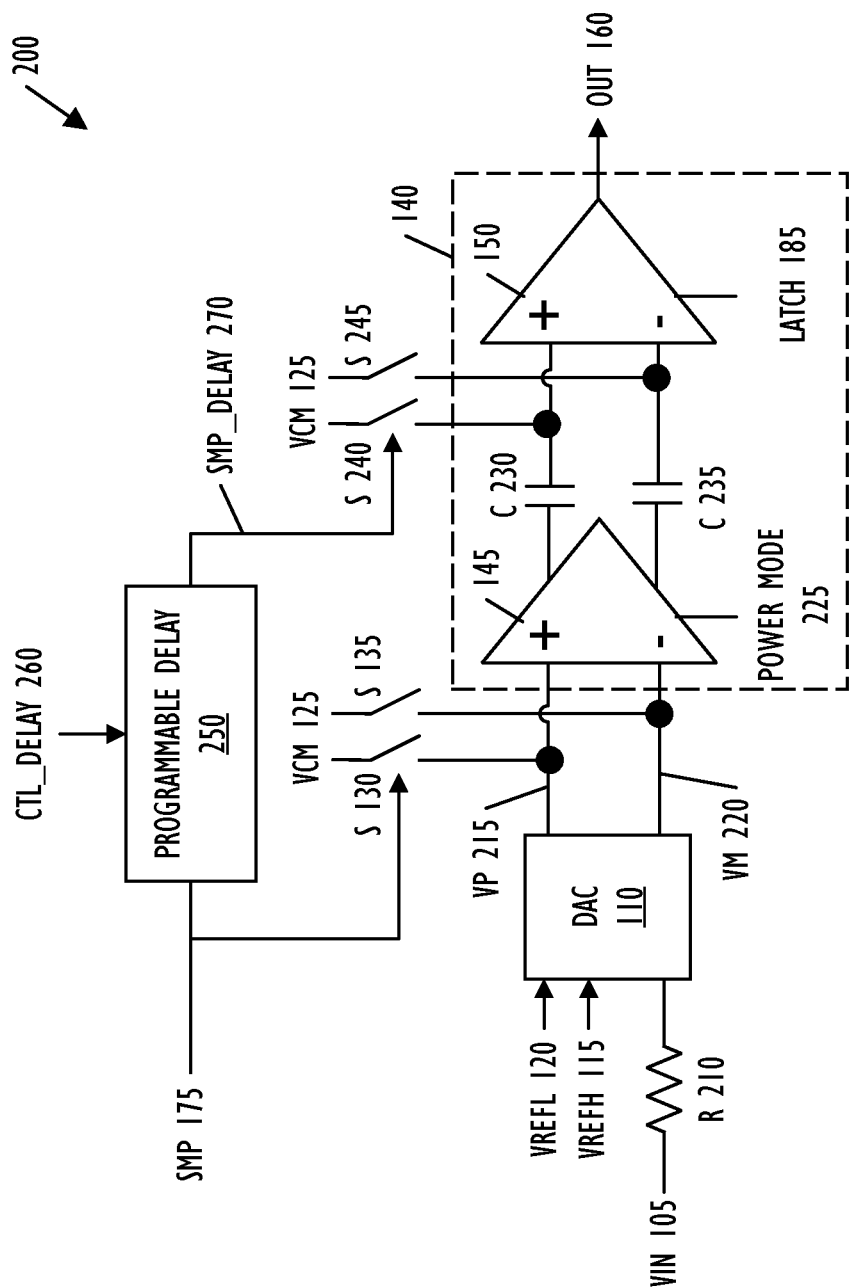
FIG. 2 shows, in block diagram form, an example ADC system with a programmable delay to reduce sampling noise, according to one embodiment.

The preamplifier 145 reduces non-idealities introduced by the latch 150, such as offset, noise, and voltage kick-back to the DAC 110, for example using techniques such as auto-zeroing. The sampling kT/C noise can be reduced at least in part by introducing a delay into the comparator 140, as described further herein with respect to FIG. 2. FIG. 2 shows, in block diagram form, an example ADC system 200 with a programmable delay to reduce sampling noise, according to one embodiment. For ease of explanation, the example ADC system 200 is described herein with reference to the ADC system 100 shown in FIG. 1, such that similar numbers refer to similar components. In addition, the SAR logic unit 170 is omitted from the diagram of ADC system 200 for simplification. The ADC system 200 includes the components of ADC system 100 as well as a resistor R 210 representing the source impedance of the driving circuitry for the input signal Vin 105, the capacitors C 230 and 235, the switches S 240 and 245, and the programmable delay unit 250. The input signal Vin 105 is provided to a first terminal of the resistor R 210, and a second terminal of the resistor R 210 is coupled to the DAC 110.

The first output of the DAC 110 is represented as VP 215 and coupled to a positive input of the preamplifier 145 in the comparator 140, and a second output of the DAC 110 is represented as VM 220 and coupled to a negative input of the preamplifier 145. The first output of the preamplifier 145 is coupled to a first terminal of a capacitor C 230, and the second output of the preamplifier 145 is coupled to a first terminal of a capacitor C 235. The second terminal of the capacitor C 230 is coupled to the positive input of the latch 150, and the second terminal of the capacitor C 235 is coupled to the negative input of the latch 150.

The positive input of the latch 150 is coupled to a first terminal of switch S 240, and the negative input of the latch 150 is coupled to a first terminal of switch S 245. The second terminals of the switches S 240 and 245 are configured to receive a common mode voltage VCM 125. In this example, the same common mode voltage VCM 125 is used for the sampling switches S 130 and 135 and the latch input switches S 240 and 245, but in other implementations, different common mode voltages may be used. The switches S 240 and 245 are configured to open and close based on a delayed sampling control signal SMP_DELAY 270 provided by the programmable delay unit 250. The programmable delay unit 250 generates the delayed sampling control signal SMP_DELAY 270 based on the sampling control signal SMP 175 provided by the SAR logic unit 170.

The sampling noise of the ADC system 200 can be reduced using the technique that follows. During the sampling phase, for example while the sampling control signal SMP 175 is logic high, the sampling switches S 130 and 135 are closed to sample the input voltage VIN 105 at the input of the DAC 110. An offset voltage of the preamplifier 145 is increased by a gain A of the preamplifier 145 and stored on the capacitors C 230 and 235. At the end of the sampling phase, for example at the falling edge of the sampling control signal SMP 175, the sampling switches S 130 and 135 are opened, disconnecting the positive and negative inputs of the preamplifier 145 from the common mode voltage VCM 125. Sampling errors Vse are introduced from kT/C noise, charge injection, and clock feedthrough as a differential voltage between Vp 215 and Vm 220. The sampling errors Vse are amplified by the gain A of the preamplifier 145 and stored on the capacitors C 230 and 235 along with the preamplifier offset voltage.

At the end of the delayed sampling phase, for example at the falling edge of the delayed sampling control signal SMP_DELAY 270, the latch input switches S 240 and 245 are opened, disconnecting the positive and negative inputs of the latch 150 from the common mode voltage VCM 125. The amplified sampling errors AVse, the preamplifier offset voltage, and the change in Vin 105 over the delay between the falling edge of the sampling control signal SMP 175 and the falling edge of the delayed sampling control signal SMP_DELAY 270 are stored on the capacitors C 230 and 235, creating a new sampling error Vse2 from kt/C noise of C 230 and C 235 and charge-injection and clock feedthrough from switches S 240 and S 245. This new sampling error Vse2 when referred back to VP 215 and VM 220, is attenuated by the gain A of the preamplifier 145. After processing by the SAR logic unit 170 and ignoring quantization error, the ADC output code is approximately equal to the value of the input voltage signal Vin 105 at the falling edge of the delayed sampling control signal SMP_DELAY 270 plus the second sampling error Vse2 divided by the gain A of the preamplifier 145. The sampling error Vse is cancelled and the second sampling error Vse2 is divided by the gain A of the preamplifier 145. For a gain A of five and assuming infinite preamplifier bandwidth, the second sampling error Vse2 is reduced by approximately 80%. The new sampling time for the input voltage Vin 105 is at the falling edge of the delayed sampling control signal SMP_DELAY 270, not the falling edge of the sampling control signal SMP 175.

A trade-off in using this particular technique to cancel sampling errors is the delay between the falling edge of the sampling control signal SMP 175 and the falling edge of the delayed sampling control signal SMP_DELAY 270 versus the bandwidth of the preamplifier 145. To fully cancel the sampling error Vse, a long delay time or a very high preamplifier bandwidth is needed. Long delay times can lead to preamplifier saturation from the changing value of Vin 105 during the delays, and high preamplifier bandwidth can lead to high power consumption. The tradeoff between a fixed delay and the bandwidth of the preamplifier 145 can be optimized for specific implementations and a known, constant input frequency, but to accommodate a varying input frequency and source resistance Rs 210, the delay time can be varied.

For example, the programmable delay unit 250 can adjust the delay between the falling edge of the sampling control signal SMP 175 and the falling edge of the delayed sampling control signal SMP_DELAY 270 based on the control signal CTL_DELAY 260, which can be provided by a controller. The delay between the falling edge of the sampling control signal SMP 175 and the falling edge of the delayed sampling control signal SMP DELAY 270 can be chosen based on the sampling frequency, the source resistance Rs 210, a power mode for the ADC system 200, and other ADC control settings, such as the clock frequency of clock signal CLK 165, a sampling time, a resolution mode, an oversampling ratio, and the like for the ADC system 200.

For example, the delay can be chosen based on the sampling frequency and an assumption that the maximum input frequency of the input signal Vin 105 is approximately half the sampling frequency. As another example, a user can provide the maximum input frequency of the input signal Vin 105 and/or the source resistance R 210 based on the particular implementation. In response to the source resistance R 210 being greater than a threshold resistance, the programmable delay unit 250 can set a long, multi-cycle delay or disable the delay entirely. The threshold resistance can be chosen to be a resistance that causes the settling time to be high enough that ADC conversion errors occur.

The programmable delay unit 250 can be any appropriate delay unit or combination of delay units that achieve a desired delay resolution for the particular implementation. For example, the programmable delay unit 250 can be an analog delay unit such as a fixed current charging a programmable capacitance followed by a Schmitt trigger or comparator; a programmable current charging a fixed capacitance followed by a Schmitt trigger or comparator; programmable logic delay stages that can be calibrated with a reference clock; or a combination thereof. Alternatively, the programmable delay unit 250 can be a digital delay unit such a programmable number of clock cycles or half cycles. As a further alternative, the programmable delay unit 250 can be a combination of analog and digital delay units.

Figure 3:
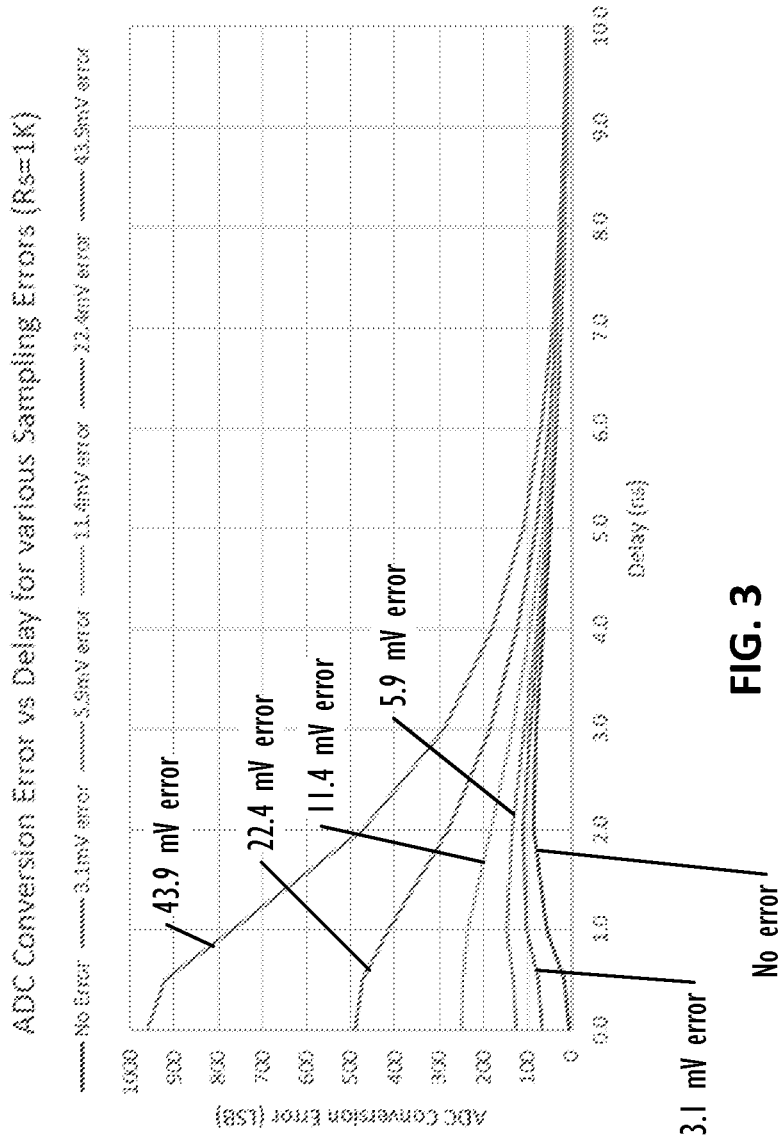
FIG. 3 shows a graph of ADC conversion error over delay, according to one embodiment.

FIG. 3 shows a graph 300 of ADC conversion error over delay, according to one embodiment. The graph 300 shows a plurality of sampling errors, ranging from zero millivolts (mV) or no error, to 43.9 mV, and the corresponding ADC conversion errors over delay. The graph 300 is based on a value for Rs 210 of 1 kilo-Ohms (kΩ). The shape of these conversion error curves will vary for different values of Rs 210 and other factors such as preamplifier bandwidth. The ADC conversion errors are measured in number of least-significant bits (LSBs). An LSB is defined as the difference between the high reference voltage VREFH 115 and the low reference voltage VREFL 120 divided by two to the nth power, where n is the number of bits in the ADC. With sufficiently long delays and settling time, all values of the sampling error approach zero conversion errors. However, the wrong delay time can introduce error. For example, the zero mV sampling error corresponds to approximately 90 LSBs of conversion error at a two nanosecond delay, rather than corresponding to no conversion error as expected. The programmable delay enabled by the programmable delay unit 250 in ADC system 200 allows the delay to be varied for the particular implementation and Rs 210 value and reduce the likelihood of errors or increasing errors by mistake.

As described herein, the disclosed techniques for implementing a programmable delay allow SAR ADCs to reduce sampling noise while accommodating a range of input source impedances, signal frequencies, and power restrictions. For example, the programmable delay allows a SAR ADC to reduce sampling noise for a particular input signal frequency and source impedance of the input signal driving circuitry while also reducing the power used by the preamplifier. In addition, a general-purpose SAR ADC used in a variety of applications can be adjusted based on the current operating parameters to reduce sampling noise across a range of use-cases.

Features specifically shown or described with respect to one embodiment set forth herein may be implemented in other embodiments set forth herein.

In this description, the term "couple" may cover connections, communications, or signal paths that enable a functional relationship consistent with this description, including intermediate or intervening components that do not alter the functional relationship. A device that is "configured to" perform a task or function may be configured by programming or hardwiring, for example, at a time of manufacturing by a manufacturer and/or may be configurable or reconfigurable by a user after manufacturing. The configuring may be done through firmware and/or software, construction and/or layout of hardware components and connections, or any combination thereof. As used herein, "node", "pin", and "lead" are used interchangeably. A circuit or device described herein as including certain components may be adapted to be coupled to those components instead, to form the described circuitry or device.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

An analog-to-digital converter (ADC) includes a digital-to-analog converter (DAC), a comparator coupled to an output of the DAC, a successive approximation register (SAR) logic unit coupled to an output of the comparator, and a programmable delay unit. The comparator includes a preamplifier and a latch. An input of the preamplifier is coupled to the output of the DAC and an input of the latch is coupled to an output of the preamplifier. The SAR logic unit is coupled to an input of the latch and configured to generate a control signal for the comparator. The programmable delay unit is configured to delay the control signal, such that the comparator receives the control signal and a delayed control signal. The programmable delay unit is configured to adjust a delay between the control signal and the delayed control signal based on at least one parameter.

In some implementations, the ADC also includes a first switch and a second switch. The first switch has a first terminal coupled to the input of the preamplifier and a second terminal coupled to a first common mode voltage supply rail, and is configured to open and close based on the control signal. The second switch has a third terminal coupled to the input of the latch and a fourth terminal coupled to a second common mode voltage supply rail, and is configured to open and close based on the delayed control signal. In some implementations, the first common mode voltage supply rail and the second common mode voltage supply rail provide different common mode voltages. In other implementations, the first common mode voltage supply rail and the second common mode voltage supply rail provide a same common mode voltage.

In some implementations, the at least one parameter includes at least one of a frequency of an input signal provided to the DAC, a source impedance of a circuit driving the input signal provided to the DAC, a power mode of the preamplifier, a clock frequency of the ADC, a sampling time of the ADC, a resolution mode of the ADC, and an oversampling ratio of the ADC. In some implementations, the at least one parameter is input by a user.

In some implementations, the programmable delay unit is configured to implement a first delay between the control signal and the delayed control signal for a first input signal provided to the DAC and a second delay between the control signal and the delayed control signal for a second input signal. In some implementations, the programmable delay unit includes at least one of an analog delay unit and a digital delay unit. The at least one of the analog delay unit and the digital delay unit enable a desired delay resolution for the programmable delay unit. In some implementations, the programmable delay unit is configured to reduce the delay between the control signal and the delayed control signal such that the control signal and the delayed control signal are substantially the same in response to a source impedance of a circuit driving the input signal provided to the DAC being greater than a predetermined threshold.

A device includes a comparator and a programmable delay unit. The comparator includes a preamplifier and a latch. An input of the preamplifier is configured to receive an input signal, and an input of the latch is coupled to an output of the preamplifier. The programmable delay unit is configured to delay a control signal for the comparator, such that the comparator receives the control signal and a delayed control signal. The programmable delay unit is configured to adjust a delay between the control signal and the delayed control signal based on at least one parameter.

In some implementations, the device also includes a first switch and a second switch. The first switch has a first terminal coupled to the input of the preamplifier and a second terminal coupled to a first common mode voltage supply rail, and is configured to open and close based on the control signal. The second switch has a third terminal coupled to the input of the latch and a fourth terminal coupled to a second common mode voltage supply rail, and is configured to open and close based on the delayed control signal. In some implementations, the first common mode voltage supply rail and the second common mode voltage supply rail provide different common mode voltages. In other implementations, the first common mode voltage supply rail and the second common mode voltage supply rail provide a same common mode voltage.

In some implementations, the at least one parameter includes at least one of a frequency of the input signal, a source impedance of a circuit driving the input signal, a power mode of the preamplifier, a clock frequency of the device, a sampling time, a resolution mode, and an oversampling ratio. In some implementations, the at least one parameter is input by a user.

In some implementations, the programmable delay unit is configured to implement a first delay between the control signal and the delayed control signal for a first input signal and a second delay between the control signal and the delayed control signal for a second input signal. In some implementations, the programmable delay unit includes at least one of an analog delay unit and a digital delay unit. The at least one of the analog delay unit and the digital delay unit enable a desired delay resolution for the programmable delay unit. In some implementations, the programmable delay unit is configured to reduce the delay between the control signal and the delayed control signal such that the control signal and the delayed control signal are substantially the same in response to a source impedance of a circuit driving the input signal being greater than a predetermined threshold.

What is claimed is:

1. An analog-to-digital converter (ADC) comprising:
 a digital-to-analog converter (DAC);
 a comparator coupled to an output of the DAC, the comparator comprising a preamplifier and a latch, wherein an input of the preamplifier is coupled to the output of the DAC and an input of the latch is coupled to an output of the preamplifier;
 a successive approximation register (SAR) logic unit coupled to an output of the latch and configured to generate a control signal for the comparator; and
 a programmable delay unit configured to delay the control signal, such that the comparator receives the control signal and a delayed control signal, wherein the programmable delay unit is configured to adjust a delay between the control signal and the delayed control signal based on at least one parameter; and
 wherein the programmable delay unit is configured to implement a first delay between the control signal and the delayed control signal for a first input signal provided to the DAC and a second delay between the control signal and the delayed control signal for a second input signal.

2. The ADC of claim 1, further comprising:
 a first switch having a first terminal coupled to the input of the preamplifier and a second terminal coupled to a first common mode voltage supply rail, wherein the first switch is configured to open and close based on the control signal; and
 a second switch having a third terminal coupled to the input of the latch and a fourth terminal coupled to a second common mode voltage supply rail, wherein the second switch is configured to open and closed based on the delayed control signal.

3. The ADC of claim 2, wherein the first common mode voltage supply rail is configured to provide a different common mode voltage than the second common mode voltage supply rail.

4. The ADC of claim 2, wherein the first common mode voltage supply rail is configured to provide a same common mode voltage as the second common mode voltage supply rail.

5. The ADC of claim 1, wherein the at least one parameter comprises at least one of a frequency of an input signal provided to the DAC, a source impedance of a circuit driving the input signal provided to the DAC, a power mode of the preamplifier, a clock frequency of the ADC, a sampling time of the ADC, a resolution mode of the ADC, and an oversampling ratio of the ADC.

6. The ADC of claim 1, wherein the at least one parameter comprises a user-input parameter.

7. The ADC of claim 1, wherein the programmable delay unit comprises at least one of an analog delay unit and a digital delay unit, wherein the at least one of the analog delay unit and the digital delay unit enable a desired delay resolution for the programmable delay unit.

8. The ADC of claim 1, wherein the programmable delay unit is configured to reduce the delay between the control signal and the delayed control signal such that the control signal and the delayed control signal are substantially the same in response to a source impedance of a circuit driving the input signal provided to the DAC being greater than a predetermined threshold.

9. A device comprising:
 a comparator comprising a preamplifier and a latch, wherein an input of the preamplifier is configured to receive an input signal and an input of the latch is coupled to an output of the preamplifier; and
 a programmable delay unit configured to delay a control signal for the comparator, such that the comparator receives the control signal and a delayed control signal, wherein the programmable delay unit is configured to adjust a delay between the control signal and the delayed control signal based on at least one parameter, and wherein the programmable delay unit is configured to implement a first delay between the control signal and the delayed control signal for a first input signal and a second delay between the control signal and the delayed control signal for a second input signal.

10. The device of claim 9, further comprising:
 a first switch having a first terminal coupled to the input of the preamplifier and a second terminal coupled to a first common mode voltage supply rail, wherein the first switch is configured to open and close based on the control signal; and
 a second switch having a third terminal coupled to the input of the latch and a fourth terminal coupled to a second common mode voltage supply rail, wherein the second switch is configured to open and closed based on the delayed control signal.

11. The device of claim 9, wherein the at least one parameter comprises at least one of a frequency of the input signal, a source impedance of a circuit driving the input signal, a power mode of the preamplifier, a clock frequency of the device, a sampling time, a resolution mode, and an oversampling ratio.

12. The device of claim 9, wherein the at least one parameter comprises a user-input parameter.

13. The device of claim 9, wherein the programmable delay unit comprises at least one of an analog delay unit and a digital delay unit, wherein the at least one of the analog delay unit and the digital delay unit enable a desired delay resolution for the programmable delay unit.

14. A device comprising:
 a comparator comprising a preamplifier and a latch, wherein an input of the preamplifier is configured to receive an input signal and an input of the latch is coupled to an output of the preamplifier;
 a programmable delay unit configured to delay a control signal for the comparator, such that the comparator receives the control signal and a delayed control signal, wherein the programmable delay unit is configured to adjust a delay between the control signal and the delayed control signal based on at least one parameter;
 a first switch having a first terminal coupled to the input of the preamplifier and a second terminal coupled to a first common mode voltage supply rail, wherein the first switch is configured to open and close based on the control signal; and a second switch having a third terminal coupled to the input of the latch and a fourth terminal coupled to a second common mode voltage supply rail, wherein the second switch is configured to open and closed based on the delayed control signal.

15. The device of claim 14, wherein the first common mode voltage supply rail is configured to provide a different common mode voltage than the second common mode voltage supply rail.

16. The device of claim 14, wherein the at least one parameter comprises at least one of a frequency of an input signal provided to the DAC, a source impedance of a circuit driving the input signal provided to the DAC, a power mode of the preamplifier, a clock frequency of the ADC, a sampling time of the ADC, a resolution mode of the ADC, and an oversampling ratio of the ADC.

17. The device of claim 14, wherein the at least one parameter comprises a user-input parameter.

18. The device of claim 14, wherein the programmable delay unit is configured to implement a first delay between the control signal and the delayed control signal for a first input signal and a second delay between the control signal and the delayed control signal for a second input signal.

19. The device of claim 14, wherein the programmable delay unit comprises at least one of an analog delay unit and a digital delay unit, wherein the at least one of the analog delay unit and the digital delay unit enable a desired delay resolution for the programmable delay unit.

20. The device of claim 14, wherein the programmable delay unit is configured to reduce the delay between the control signal and the delayed control signal such that the control signal and the delayed control signal are substantially the same in response to a source impedance of a circuit driving the input signal provided to the DAC being greater than a predetermined threshold.

* * * * *